US008460414B2

(12) United States Patent
Etoh et al.

(10) Patent No.: US 8,460,414 B2
(45) Date of Patent: Jun. 11, 2013

(54) POLISHING SLURRY AND POLISHING MATERIAL USING SAME

(75) Inventors: Akinori Etoh, Ichihara (JP); Setsuko Oike, Sodegaura (JP); Tomokazu Ishizuka, Ichihara (JP); Shigeharu Fujii, Ichihara (JP); Kiyotaka Shindo, Otake (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 916 days.

(21) Appl. No.: 11/918,226

(22) PCT Filed: Apr. 14, 2006

(86) PCT No.: PCT/JP2006/307907
§ 371 (c)(1),
(2), (4) Date: Oct. 11, 2007

(87) PCT Pub. No.: WO2006/112377
PCT Pub. Date: Oct. 26, 2006

(65) Prior Publication Data
US 2009/0064597 A1 Mar. 12, 2009

(30) Foreign Application Priority Data

Apr. 14, 2005 (JP) ................................. 2005-116475
Mar. 3, 2006 (JP) ................................. 2006-057117

(51) Int. Cl.
*B24D 3/28* (2006.01)
*B24D 3/344* (2006.01)
*C09G 1/16* (2006.01)
*D21H 17/375* (2006.01)
*A61K 47/48176* (2006.01)

(52) U.S. Cl.
USPC ............. 51/298; 51/293; 522/175; 162/168.3

(58) Field of Classification Search
USPC ........ 51/293, 298; 451/41; 106/3; 162/168.3; 428/41.5; 522/175; 524/812
See application file for complete search history.

(56) References Cited

U.S. PATENT DOCUMENTS

| 4,443,108 A | 4/1984 | Webster |
| 5,356,968 A * | 10/1994 | Rupaner et al. ............... 524/157 |
| 6,568,997 B2 | 5/2003 | Costas et al. |
| 6,582,761 B1 | 6/2003 | Kazuo et al. |
| 6,641,630 B1 * | 11/2003 | Sun ................................ 51/307 |
| 2001/0020348 A1 | 9/2001 | Ueda et al. |
| 2002/0173241 A1 * | 11/2002 | Costas et al. .................... 451/41 |
| 2002/0193451 A1 * | 12/2002 | Motonari et al. ................ 516/9 |
| 2003/0017785 A1 * | 1/2003 | Ueda et al. ....................... 451/41 |
| 2003/0065047 A1 * | 4/2003 | Katou ................................ 522/1 |
| 2004/0148867 A1 * | 8/2004 | Matsumi ......................... 51/298 |
| 2004/0161932 A1 * | 8/2004 | Matsui et al. ................. 438/689 |

FOREIGN PATENT DOCUMENTS

| JP | 07-086216 A | 3/1995 |
| JP | 11-195628 A | 7/1999 |
| JP | 11-216663 A | 8/1999 |
| JP | 11-333699 A | 12/1999 |
| JP | 2000-183003 A | 6/2000 |
| JP | 2001-055559 A | 2/2001 |
| JP | 2001-152135 A | 6/2001 |
| JP | 2001-267273 A | 9/2001 |
| JP | 2002-261052 A | 9/2002 |
| JP | 2004-14813 A | 1/2004 |
| JP | 2004-123931 A | 4/2004 |
| JP | 2004-123950 A | 4/2004 |
| JP | 2004-532521 A | 10/2004 |
| JP | 2004-311967 A | 11/2004 |
| JP | 2004-335689 A | 11/2004 |
| KR | 2001-0070475 | 7/2001 |
| WO | WO 00/13217 A1 | 3/2000 |
| WO | WO 01/17006 A1 | 3/2001 |
| WO | WO 02/081584 * | 10/2002 |
| WO | WO 02/081584 A1 | 10/2002 |

OTHER PUBLICATIONS

Computer English-language translation of Japanese Patent Publication No. 2004-311967.
Written Opinion dated Aug. 10, 2006 for corresponding International Application No. PCT/SE2006/000577.
Official Action issued in corresponding Japanese Patent Application No. 2007-526848 dated Jan. 11, 2011 with English Translation.

* cited by examiner

*Primary Examiner* — Pegah Parvini
(74) *Attorney, Agent, or Firm* — Buchanan Ingersoll & Rooney PC

(57) ABSTRACT

Disclosed is a polishing slurry which enables to suppress damages to an under layer while securing an adequate polishing rate. The polishing slurry contains a resin (A) having an amide group and an organic resin (B).

10 Claims, No Drawings

POLISHING SLURRY AND POLISHING MATERIAL USING SAME

TECHNICAL FIELD

The present invention relates to a polishing slurry and a polishing material using such a polishing slurry. In particular, the invention relates to a polishing slurry for polishing a surface of an insulating film or a metal interconnect such as tungsten, aluminum, copper or the like in a process of forming an interconnect for the production of semiconductor devices.

BACKGROUND ART

In a polishing technique, there has been required that damages to an under layer are suppressed while an adequate polishing rate is secured.

For example, in late years, in a process of forming an interconnect in the manufacture of semiconductor devices, as a technique for forming a trench for forming the interconnect on an insulating film, embedding a metal film for the interconnect in the trench by the plating method, removing an excess metal film and smoothing the insulating film including metal interconnect, CMP (Chemical and Mechanical Polishing) has been used. This is a method of mechanically polishing a polished surface which is chemically deteriorated by a slurry with abrasive particles dispersed therein.

A CMP process is an essential process in the processing of insulating film materials such as silicon oxide and the like as well as metallic materials such as a copper interconnect, a tantalum barrier metal, a tungsten plug and the like. In the future, however, in order to reduce the cost involved in the process, it has been demanded that a high polishing rate is obtained just with a little supply of slurries, and damages to the under layer hardly take place. As damages to the under layer in CMP, there can be exemplified scratch, dishing and erosion.

Of such damages, scratch refers to abrasive damages on a metal surface, and is created by the hardness of abrasive particles or the partial excessive polishing generated by the existence of an aggregate of abrasive particles.

Furthermore, dishing or erosion causes an increase or deviation in interconnect resistance and a short circuit between interconnects formed on an upper layer, thereby considerably deteriorating the reliability of devices having an interconnect structure and drastically lowering the product yield.

Of these, erosion is a phenomenon of forming concave portions by further polishing an object to be polished including an insulating film, i.e., an under layer as well in the center of a dense area of an interconnect pattern. Erosion is caused by excessive polishing due to hard abrasive particles or a low polishing selectivity with an insulating film or an under layer such as a barrier layer for preventing diffusion of a metal.

Furthermore, dishing is easily caused by elution (etching) of a metal due to a slurry in the acidic range that is the corroded region of a metal, a complex forming agent contained in the slurry or a pH adjusting agent. Furthermore, a slurry having a stronger chemical reactivity because of an additive than a mechanical reactivity because of abrasive particles easily causes dishing.

In the CMP technique, a slurry containing a metal oxide such as ceria, alumina or the like, or an inorganic abrasive particle such as silica has been used from the past. However, these inorganic abrasive particles have high hardness, and aggregates of abrasive particles or polished debris in liquid waste are hardly discharged. So, when a metal film with low hardness such as copper or the like is polished, the aforementioned scratch or erosion might occur in some cases.

That is, at present, in order to improve performance of semiconductors, the ½ width of interconnects (half pitch) on an insulating film becomes much finer from 90 nm to 65 nm and even to 45 nm, and a surface of the insulating film to be polished is of a much complicated structure. If the width of interconnects becomes much finer, abrasive damages to the metal surface due to scratches cause an open circuit, and erosion causes an increase or deviation in interconnect resistance and a short circuit between interconnects formed on an upper layer, thereby considerably deteriorating the reliability of semiconductor devices and drastically lowering the product yield.

In order to solve these problems, in case of inorganic abrasive particles, a polishing solution with abrasive particles composed of silica which is softer than alumina and polishing in a neutral to alkaline range without causing elution of a metal by forming a passive film of a metal has been under development. For example, when silica is used as abrasive particles, scratches are reduced as compared to alumina. However, when inorganic abrasive particles are used, a metal is mechanically polished so that scratch or erosion occurs due to aggregates of abrasive particles or polishing debris of the metal and occurrence of defects cannot be thoroughly prevented.

Furthermore, the conventional polishing techniques are described in Patent Documents 1 to 10.

In Patent Documents 1 and 2, in order to effectively use the supplied slurry, optimization of trench patterns on a polishing pad has been studied.

Meanwhile, in Patent Document 3, there has been disclosed a method employing particles of an organic polymer compound as abrasive particles. Examples of the organic polymer used therein include a methacrylic resin, a polystyrene resin and the like.

However, these organic polymers do not have functional groups which easily react with a metal film. In the same document, since these components are used as abrasive particles and the organic polymers do not contain an oxidizing agent for oxidizing a surface of the metal, a chemical action with the metal film to be polished never takes place. Thus, a sufficient polishing rate required for an interconnect process in the manufacture of semiconductor devices is not obtained.

Meanwhile, in order to solve the above problems on particles of the organic polymer compound, for example, in Patent Document 4, there has been disclosed an aqueous dispersion for polishing containing organic particles having functional groups capable of reacting with a metal forming a surface to be polished. However, also in the art described in the same document, a phenomenon called dishing of forming concave portions by further polishing a metal film of an interconnect portion in the center has not been solved.

Further, in Patent Document 5, there has been disclosed a polishing slurry containing a chelating resin and inorganic abrasive particles.

Further, in Patent Documents 6 and 7, there has been disclosed a polishing liquid for CMP containing a polyacrylic acid for the purpose of reducing dishing by suppressing etching.

Further, in Patent Documents 8 and 9, there has been described a polishing agent for CMP containing a protective film-forming agent and a water-soluble polymer.

Further, in Patent Document 10, there has been described a polishing slurry combining suppression of etching and a high polishing rate by forming a brittle insoluble metal complex using a complex forming agent such as a quinolinecarboxylic acid or the like.

However, even though these techniques are used, they have been further improved from the viewpoint of suppressing damages to an under layer while securing a more adequate polishing rate.

Patent Document 1: Japanese Patent Laid-open No. 1999-216663

Patent Document 2: Japanese Patent Laid-open No. 1999-333699

Patent Document 3: Japanese Patent Laid-open No. 1995-86216

Patent Document 4: Japanese Patent Laid-open No. 2001-55559

Patent Document 5: Japanese Patent Laid-open No. 2002-261052

Patent Document 6: Japanese Patent Laid-open No. 1999-195628

Patent Document 7: Published Japanese Translations of PCT International Publication for Patent Applications No. 2004-532521

Patent Document 8: International Publication (WO) No. WO00/13217, pamphlet

Patent Document 9: International Publication (WO) No. WO01/17006, pamphlet

Patent Document 10: Japanese Patent Laid-open No. 2000-183003

DISCLOSURE OF THE INVENTION

According to the present invention, there is provided a polishing slurry containing a water-soluble resin (A) having an amide group and an organic particle (B).

Furthermore, according to the present invention, there is provided a polishing material containing the above polishing slurry, an oxidizing agent, a water-soluble compound capable of forming a complex with a metal and an anti-corrosive agent.

Further, according to the present invention, there is provided a polishing material containing the above polishing slurry, a compound capable of forming a complex with a metal and water.

In the present invention, since the polishing slurry contains a water-soluble resin (A) having an amide group and an organic particle (B), the equivalent polishing rate is obtained even without containing inorganic abrasive particles. Also, since a water-soluble resin (A) having an amide group and an organic particle (B) are contained, damages to a surface to be polished can be effectively suppressed.

As described above, according to the present invention, it is possible to suppress damages to an under layer while securing an adequate polishing rate.

BEST MODE FOR CARRYING OUT THE INVENTION

Hereinafter, the polishing slurry of the present invention is described as used for a technique in the manufacture of semiconductors as an example, but the application field of the polishing slurry of the present invention is not particularly limited. For example, the polishing slurry can also be used for polishing various substrates including glass substrates.

The polishing slurry of the present invention contains a water-soluble resin (A) having an amide group and an organic particle (B).

Incidentally, in the present invention, a water-soluble resin refers to a resin in a medium mainly composed of water as dissolved in that medium, while an organic particle refers to a resin in a medium mainly composed of water as formed in a particle shape.

In the present invention, since an organic particle (B) is contained, damages to a surface to be polished can be effectively suppressed. This effect is remarkably exerted when an inorganic particle is not contained in a polishing material. For example, a polishing slurry containing an organic particle (B) which is softer than copper is used for the formation of a copper interconnect structure, whereby erosion at the time of excessive polishing is suppressed, as compared to a case in which an inorganic particle is used. Furthermore, since a particle which is harder than copper is not contained, damages (scratches) can be prevented from being occurred.

The polishing slurry of the present invention may contain a water-soluble resin (A) having an amide group and an organic particle (B) in any form. Examples thereof include (i) a form of a resin composition obtained by separately synthesizing a water-soluble resin (A) having an amide group and an organic particle (B), and mixing;

(ii) a form of a resin composition obtainable by polymerizing an organic particle (B) in the presence of a water-soluble resin (A) having an amide group; and (iii) a form of a resin composition obtainable by polymerizing a water-soluble resin (A) having an amide group in the presence of an organic particle (B).

Of these, from the viewpoint of the storage stability of an emulsion, more preferably used is a resin composition obtained by synthesizing any one resin of a water-soluble resin (A) having an amide group or an organic particle (B) in the presence of the other resin.

Incidentally, in the polishing slurry of the present invention, an organic particle (B) may also be a particle obtainable by polymerizing one or more vinyl monomers by an emulsion polymerization or the like. An organic particle (B) obtainable by the polymerization according to the emulsion polymerization is hereinafter exemplified.

Even in this case, an organic particle (B) obtainable by subjecting a water-soluble resin (A) having an amide group and one or more vinyl monomers to the emulsion polymerization may exist in any form, but more preferably used is a resin composition obtained by synthesizing any one resin of a resin (A) containing an amide group or a resin (B) obtainable by subjecting one or more vinyl monomers to the emulsion polymerization in the presence of the other resin, from the viewpoint of the storage stability of an emulsion.

For example, a water-soluble resin (A) having an amide group may also be a resin obtainable by the emulsion polymerization in the presence of an organic particle (B) obtainable by polymerizing one or more vinyl monomers.

Furthermore, an organic particle (B) is obtainable by subjecting one or more vinyl monomers to the emulsion polymerization in the presence of a water-soluble resin (A) having an amide group, whereby the dispersion stability can be much more enhanced.

The present invention will be illustrated further in detail below.

[Water-Soluble Resin (A) Having an Amide Group]

The water-soluble resin (A) having an amide group of the present invention is a resin obtainable by polymerizing at least a compound having an amide group.

As the compound having an amide group, particularly preferred is methacrylamide.

The water-soluble resin (A) having an amide group of the present invention may be obtained by polymerizing one or more vinyl monomers in addition to a compound having an amide group.

Herein, as one or more vinyl monomers, a vinyl monomer having a functional group is preferred. Examples thereof include a vinyl monomer having an amide group such as acrylamide or the like;
a vinyl monomer having a carboxyl group such as a (meth) acrylic acid or the like; a vinyl monomer having a hydroxyl group such as 2-hydroxyethyl(meth)acrylate or the like;
a vinyl monomer having a glycidyl group such as glycidyl (meth)acrylate or the like;
a vinyl monomer having a cyano group such as (meth)acrylonitrile or the like;
a vinyl monomer having an amino group such as N,N-dimethylaminoethyl(meth)acrylate or the like;
a vinyl monomer having an acetoacetoxy group such as acetoacetoxyethyl(meth)acrylate or the like; and
a monomer having a sulfonic acid such as sodium styrene sulfonate, sodium methallyl sulfonate or the like. Furthermore, a hydrophobic vinyl monomer such as styrene, (meth) acrylate ester or the like may also be used.

Furthermore, a crosslinking vinyl monomer may be used for the water-soluble resin (A) having an amide group, and examples of the appropriate monomer include methylene bis(meth)acrylamide, divinyl benzene, di(meth)acrylate containing a polyethylene glycol chain and the like. Furthermore, a crosslinking vinyl monomer may contain two or more vinyl groups.

Meanwhile, for the purpose of adjusting the molecular weight of the water-soluble resin (A) having an amide group, a chain transfer agent such as n-dodecyl mercaptan, 1-thioglycerol or the like, or other molecular weight modifiers may also be used.

As for the molecular weight of the water-soluble resin (A) having an amide group, the weight-average molecular weight Mw is, for example, not less than 5,000 and preferably not less than 10,000 from the viewpoint of the stability of the polishing rate. Further, as for the molecular weight of the water-soluble resin (A) having an amide group, the weight-average molecular weight Mw is, for example, not more than 500,000 and preferably not more than 200,000 lest the viscosity of a polishing slurry should be excessively increased.

Incidentally, the water-soluble resin (A) having an amide group is measured, for example, in accordance with the GPC-MALLS method using PULLULAN (product name: Shodex, a product of Showa Denko Kabushiki Kaisha) standards.

The water-soluble resin (A) having an amide group is preferably a resin obtained by polymerizing a monomer containing an amide group of 100 to 10 weight % and more preferably 100 to 50 weight %, and other vinyl type monomer of 0 to 90 weight % and more preferably 0 to 50 weight %.

Meanwhile, the polishing slurry of the present invention may contain a water-soluble resin other than the water-soluble resin (A) having an amide group. Its content is preferably from 100 to 200 weight parts based on 100 weight parts of the water-soluble resin (A) having an amide group.

[Production Method of Water-soluble Resin (A) Having Amide Group]

The synthesis method of the water-soluble resin (A) having an amide group is not particularly limited, but the polymerization conducted in a solvent having water as a main component is preferable. Particularly preferred is an aqueous solution polymerization. A polymerization initiator used at the time of synthesizing the water-soluble resin (A) having an amide group is not limited, but water-soluble radical initiators are preferable, and persulfates such as ammonium persulfate and the like, or water-soluble azo type initiators such as 4,4'-azobis(4-cyanovaleric acid) and the like are particularly preferable.

The polymerization temperature at the time of synthesizing the water-soluble resin (A) having an amide group is not limited, but the synthesis is preferably carried out in the temperature range of 30 to 95 degrees centigrade and particularly preferably from 50 to 85 degrees centigrade in consideration of the production time, the conversion (reaction rate) of a monomer into a copolymer and the like.

Furthermore, for the purpose of enhancing the production stability at the time of polymerization, a pH adjusting agent or EDTA that is a metal ion sealing agent, or salts thereof can also be used.

[Organic Particle (B)]

As the organic particle (B), a (co)polymer emulsion obtainable by subjecting one or more vinyl monomers to the emulsion polymerization is a preferred embodiment.

Examples of the vinyl monomer include a hydrophobic vinyl monomer such as styrene, alkyl(meth)acrylate or the like; a vinyl monomer having a cyano group such as (meth) acrylonitrile or the like;
a vinyl monomer having an amide group such as (meth) acrylamide or the like;
a vinyl monomer having a carboxyl group such as a (meth) acrylic acid or the like;
a vinyl monomer having a hydroxyl group such as 2-hydroxyethyl (meth)acrylate or the like;
a vinyl monomer having a glycidyl group such as glycidyl (meth)acrylate or the like;
a vinyl monomer having an amino group such as N,N-dimethylaminoethyl(meth)acrylate or the like;
a vinyl monomer having an acetoacetoxy group such as acetoacetoxyethyl(meth)acrylate or the like; and
a vinyl monomer having a functional group such as a vinyl monomer containing a sulfonic acid such as sodium styrene sulfonate or the like.

As needed, a crosslinking vinyl monomer may also be used. Examples of the monomer include methylene bis(meth) acrylamide, divinyl benzene, di(meth)acrylate containing a polyethylene glycol chain and the like. Furthermore, as a crosslinking vinyl monomer, those having two or more vinyl groups may also be used.

Further, for the purpose of regulating the molecular weight, a chain transfer agent such as n-dodecyl mercaptan, 1-thioglycerol and the like, or other various molecular weight modifiers can also be used.

In the present invention, the organic particle (B) obtainable by subjecting one or more vinyl monomers to the emulsion polymerization is preferably a (co)polymer emulsion obtained by subjecting one or more vinyl monomers to the emulsion polymerization in the presence of the water-soluble resin (A) having an amide group. In this case, as the water-soluble resin (A) having an amide group, preferably used is a resin obtained by polymerizing at least a monomer containing methacrylamide.

[Production Method of Organic Particle (B)]

A synthesis method of the organic particle (B) is not particularly limited, but an emulsion polymerization conducted in a solvent having water as a main component is preferred. For the purpose of improving the polymerization stability and storage stability of the organic particle (B), a surfactant or a water-soluble polymer can be properly used.

Of these, examples of the surfactant include an anionic surfactant, a cationic surfactant, a non-ionic surfactant and the like. In the production process of semiconductor devices, particularly preferred is a surfactant free from a metal.

Examples of the anionic surfactant free from a metal include dodecylbenzene sulfonic acid salts, lauryl sulfuric acid salts, alkyl diphenyl ether disulfonic acid salts, alkyl naphthalene sulfonic acid salts, dialkyl sulfosuccinic acid salts, stearic acid salts, oleic acid salts, dioctyl sulfosuccinate salts, polyoxyethylene alkyl ether sulfuric acid salts, polyoxyethylene alkyl phenyl ether sulfuric acid salts, dialkyl sulfosuccinic acid salts, stearic acid salts, oleic acid salts, tert-octylphenoxyethoxypolyethoxyethyl sulfuric acid salts and the like. For example, ammonium salts can be used.

Furthermore, the greater part of the non-ionic surfactants free from a metal generally has an ethylene glycol chain as a hydrophilic group, and does not contain a metal. Examples thereof include polyoxyethylene lauryl ether, polyoxyethylene octylphenyl ether, polyoxyethylene oleylphenyl ether, polyoxyethylene nonylphenyl ether, oxyethylene-oxypropylene block copolymers, tert-octylphenoxyethylpolyethoxyethanol, nonylphenoxyethylpolyethoxyethanol and the like.

Meanwhile, examples of the cationic surfactant free from a metal include lauryl trimethyl ammonium chloride, stearyl trimethyl ammonium chloride, cetyl trimethyl ammonium chloride, distearyl dimethyl ammonium chloride, alkyl benzyl dimethyl ammonium chloride, lauryl betaine, stearyl betaine, lauryl dimethyl amine oxide, lauryl carboxy methyl hydroxy ethyl imidazolinium betaine, coconut amine acetate, stearyl amine acetate, alkyl amine guanidine polyoxy ethanol, alkyl picolinium chloride and the like. These dispersing agents can be selected singly or in combination of 2 or more kinds.

Furthermore, a water-soluble polymer used for the purpose of improving the polymerization stability, storage stability or the like at the time of polymerization of the organic particle (B) may either contain or not contain the aforementioned water-soluble resin (A) having an amide group.

Furthermore, it is preferable that a water-soluble resin does not contain a metal in the production process of semiconductor devices. Examples of the water-soluble polymer free from a metal include water-soluble polymers such as polyvinyl alcohol, modified polyvinyl alcohol, polyvinyl pyrrolidone, (meth)acrylic acid (co)polymers, poly(meth)acrylamide (co)polymers, ethylene glycol and the like.

A polymerization initiator used at the time of synthesizing the organic particle (B) is not limited. However, preferably used is a water-soluble radical initiator and particularly preferably used is persulfate such as ammonium persulfate and the like, or a water-soluble azo type initiator such as 4,4'-azobis(4-cyanovaleric acid) and the like. In the production process of semiconductor devices, particularly preferably used is a polymerization initiator free from a metal.

Examples of the polymerization initiator free from a metal include azo compounds such as hydrogen peroxide, ammonium persulfate, an azobiscyanovaleric acid, 2,2'-azobis(2-amidinopropane) dihydrochloride, 2,2'-azobis[2-(N-phenylamidino)propane]dihydrochloride, 2,2'-azobis{2-[N-(4-chlorophenyl)amidino]propane}dihydrochloride, 2,2'-azobis{2-[N-(4-hydroxyphenyl)amidino]propane}dihydrochloride, 2,2'-azobis[2-(N-benzylamidino)propane]dihydrochloride, 2,2'-azobis[2-(N-allylamidino)propane]dihydrochloride, 2,2'-azobis{2-[N-(2-hydroxyethyl)amidino]propane}dihydrochloride, azobisisobutyronitrile, 2,2'-azobis{2-methyl-N-[1,1-bis(hydroxymethyl)-2-hydroxyethyl]propionamide}, 2,2'-azobis{2-methyl-N-[1,1-bis(hydroxymethyl)ethyl]propionamide}, 2,2'-azobis[2-methyl-N-[2-hydroxyethyl] propionamide], 2,2'-azobis(isobutyramide) dihydrate and the like; and organic peroxides such as cumene hydroperoxide, t-butyl hydroperoxide, benzoyl peroxide, t-butylperoxy-2-ethylhexanoate, t-butylperoxy benzoate, lauroyl peroxide and the like. One, two or more kinds thereof can be selected.

As the initiator, preferably used is a water-soluble initiator, and more preferably used are ammonium persulfate, azobiscyanovaleric acid and 2,2'-azobis(2-amidinopropane) dihydrochloride. The amount of the initiator used in general is from 0.1 to 5 weight %, based on the total weight of the monomers to be (co)polymerized.

The polymerization temperature at the time of synthesizing the organic particle (B) is not limited. However, in consideration of the production time, the conversion (reaction rate) of a monomer into a copolymer or the like, it is preferably in the range of 30 to 95 degrees centigrade and particularly preferably in the range of 50 to 85 degrees centigrade.

Furthermore, at the time of polymerizing the organic particle (B), for the purpose of enhancing the production stability, a pH adjusting agent or EDTA that is a metal ion sealing agent, or salts thereof can also be used. After the formation of a copolymer emulsion, pH may be adjusted by using a neutralizing agent in general such as ammonia (water), sodium hydroxide or the like and more preferably using a neutralizing agent free from a metal salt. Examples of the neutralizing agent include ammonia (water), various amines and the like.

Furthermore, in the present invention, the organic resin (B) is particularly preferably a particle consisting of a copolymer resin having a glass transition temperature of not less than 25 degrees centigrade since an effect of suppression of dishing is excellent when it is made into a polishing material. In this configuration, the water-soluble resin (A) having an amide group may also be a water-soluble copolymer resin having an amide group. Its embodiment will be described in detail below. Incidentally, in the present invention, the glass transition temperature refers to a calculated value.

(Copolymer Resin Having Glass Transition Temperature of not Less than 25° C.)

The copolymer resin having a glass transition temperature of not less than 25 degrees centigrade according to the present invention has a calculated value of the glass transition temperature of not less than 25 degrees centigrade and more preferably 40 degrees centigrade or higher and 200 degrees centigrade or lower from the viewpoints of obtaining a high polishing rate and suppressing a change in the composition on the pad at the time of polishing.

Furthermore, the copolymer resin having a glass transition temperature of not less than 25 degrees centigrade may have a functional group capable of capturing metal ions. In this manner, the polishing quality can be enhanced.

Furthermore, specifically, it is preferable that the organic resin (B) has a functional group capable of capturing metal ions, the water-soluble resin (A) having an amide group is a water-soluble copolymer resin of a vinyl monomer having an amide group, and these resins coexist. The water-soluble copolymer resin of a vinyl monomer having an amide group is present on an outer part (a surface part) of a copolymer resin having a functional group capable of capturing metal ions and having a glass transition temperature of not less than 25 degrees centigrade. By having such a configuration, a high polishing rate and a high unevenness cancellation property can be more effectively obtained.

A functional group capable of capturing metal ions can be, for example, at least one selected from the group consisting of a carboxyl group, an amide group, a sulfonic acid group, a phosphoric acid group, a cyano group, a carbonyl group and a hydroxyl group. Furthermore, examples of the functional group capable of capturing metal ions include functional groups capable of forming negative ions such as a carboxyl group, a sulfonic acid group, a phosphoric acid and the like, and neutral functional groups having high electric negative degree such as a hydroxyl group, a cyano group, a carbonyl group, an acetoacetyl group and the like.

The copolymer resin having a glass transition temperature of not less than 25 degrees centigrade according to the present invention can be produced by an aqueous solution polymerization, an emulsion polymerization, a dispersion polymerization and the like known in the art, but it is not limited thereto.

(Calculation Method of Glass Transition Temperature (Tg) of Copolymer Resin forming Organic Particle (B))

The glass transition temperature (Tg) of the copolymer resin obtained by polymerizing a plurality of monomers can be calculated and obtained by the Fox formula.

Herein, the Fox formula is used for calculating Tg of a copolymer in accordance with Tg of a homopolymer of its monomer, based on respective monomers forming a copolymer. Details are described in the Bulletin of the American Physical Society, Series 2, Vol. 1-3, page 123 (1956).

As Tgs of various unsaturated monomers in order to evaluate Tg of a copolymer according to the Fox formula, numerical values described, for example, in Shin Kobunshi Bunko (Novel Polymer Library), Vol. 7, Toryo yo Goseijushi Nyumon (Introduction to Synthetic Resins for Paints (Kyozo Kitaoka, published by Kobunshi Kankokai (Polymer Publishing Institute)), pp. 168 to 169 can be adopted. Furthermore, by using a mathematical science software "Cheops ver. 4" (Million Zillion Software Inc.), Tg of a homopolymer of a monomer can be calculated.

As the composition of a monomer constituting a particle composed of a copolymer resin, for example, on the basis of the total monomer mass, a monomer having a functional group capable of capturing metal ions is 1 to 80 weight parts, and a vinyl monomer of a homopolymer having a calculated glass transition temperature value of not less than 25 degrees centigrade is 20 to 99 weight parts, the polymer resin being obtained by polymerizing the monomers in the above ratio. Accordingly, a much higher polishing rate can be maintained and dishing can be reduced.

The content of a monomer having a functional group capable of capturing metal ions is further preferably from 5 to 60 weight parts.

Examples of the monomer having a functional group capable of capturing metal ions used in the present invention include unsaturated monobasic acids such as an acrylic acid and the like, unsaturated dibasic acids such as an itaconic acid and the like, or monoesters thereof;
sulfonic acid-containing monomers such as sodium styrene sulfonate and the like;
cyano group-containing monomers such as acrylonitrile and the like; and
ketone group-containing monomers such as acetoacetoxyethyl acrylate and the like. These monomers may be used singly or in combination of two or more kinds.

Of these monomers, particularly preferably used are an acrylic acid, a methacrylic acid, a crotonic acid, an itaconic acid, a fumaric acid, a maleic acid, an allylsulfonic acid, a methallylsulfonic acid, 2-methacroyloxyethyl acid phosphate, acetoacetoxyethyl(meth)acrylate and acetoacetoxybutyl (meth)acrylate.

Examples of the vinyl monomer having Tg of a homopolymer of not less than 25 degrees centigrade used in the present invention include hydrophobic vinyl monomers such as styrene, alkyl (meth)acrylates such as methyl methacrylate, isobornyl acrylate, isobornyl methacrylate, cyclohexyl methacrylate, ethyl methacrylate, butyl methacrylate and the like; vinyl monomers having a hydroxyl group such as 2-hydroxyethyl methacrylate and the like; and
vinyl monomers having a glycidyl group such as glycidyl methacrylate and the like. In addition, acrylonitrile, acrylamide, methacrylamide, an acrylic acid, a methacrylic acid, benzyl methacrylate, vinyl acetate and the like can be cited.

Furthermore, as a raw material of the copolymer resin forming the organic particle (B), as needed, a crosslinking vinyl monomer may be used, and examples of the monomer include methylene bis(meth)acrylamide, divinyl benzene, di(meth)acrylate containing a polyethylene glycol chain and the like.

Furthermore, a crosslinking vinyl monomer containing two or more vinyl groups may also be good.

(Water-Soluble Copolymer Resin Having Amide Group)

The polishing slurry of the present invention contains the aforementioned copolymer resin having a glass transition temperature of not less than 25 degrees centigrade as the organic resin (B) and at the same time contains a water-soluble copolymer resin having an amide group as the water-soluble resin (A) having an amide group, whereby an even higher polishing rate can be obtained. The water-soluble copolymer resin having an amide group is, for example, a copolymer resin obtainable by polymerizing a vinyl monomer having an amide group.

The water-soluble copolymer resin is a copolymer resin having high water solubility in which the light transmittance (wavelength: 400 nm, UV/VIS/NIR spectrometer JASCO V-570 used) of an aqueous solution having the content of the copolymer resin of 10 weight parts becomes not less than 85%. As a compound having an amide group, particularly preferred is methacrylamide.

In this configuration, the water-soluble copolymer resin having an amide group is a copolymer resin obtainable by polymerizing 50 to 99 weight parts of a vinyl monomer having an amide group and 1 to 50 weight parts of other vinyl monomer, on the basis of the total monomer mass, and may be water-soluble. Accordingly, a much higher polishing rate can be maintained and dishing can be reduced.

The content of the copolymer resin having an amide group is preferably not less than 1 weight % and further preferably not less than 3 weight % in the polishing slurry from the viewpoint that the chemical reaction of a metal with the water-soluble copolymer resin having an amide group is surely processed for more certainly attaining an intended polishing rate.

Furthermore, the content of the copolymer resin having an amide group is preferably not more than 20 weight % and particularly preferably not more than 10 weight % from the viewpoints of suppressing the reduction of fluidity due to the increased viscosity of the slurry and attaining a sufficient polishing rate.

(Shape of Complex of Copolymer Resin Particle and Water-Soluble Copolymer Resin Having Amide Group)

When the water-soluble resin (A) having an amide group is a water-soluble copolymer resin having an amide group and the organic particle (B) is a copolymer resin particle, a part of the water-soluble copolymer resin having an amide group is chemically or physically adsorbed on an outer part (a surface part) of the copolymer resin particle. By taking such a complex form, the pressure dependence of the polishing rate can be enhanced.

Herein, a composite particle composed of the water-soluble copolymer resin having an amide group and the copolymer resin particle refers to a resin particle which can be indirectly analyzed, and in which a particle diameter (d1) measured by a dynamic light scattering technique is greater than a particle diameter (d2) measured by the transmission electron microscope incapable of observing a water-soluble resin, and a layer (layer thickness d1-d2) having a great affinity for a copolymer resin particle is present on a place surrounding the copolymer resin particle.

Furthermore, at this time, a copolymer resin obtainable by polymerizing a vinyl monomer having an amide group may cover an outer part and/or a surface part of a particle consisting of a copolymer resin having a functional group capable of capturing metal ions. Incidentally, the outer part refers to the outer portion inside the particle (core), while the surface part refers to a region in the vicinity of the particle surface. Herein, a vinyl monomer having an amide group may be (meth) acrylamide.

A composite resin particle composed of a water-soluble copolymer resin having an amide group and a copolymer resin particle can be obtained, for example, by polymerizing a particle consisting of a copolymer resin in the presence of a water-soluble copolymer resin having an amide group, polymerizing a water-soluble copolymer resin having an amide group in the presence of a resin particle, or polymerizing both of them respectively and then mixing.

Meanwhile, when a copolymer resin is obtained, as needed, mercaptans such as t-dodecyl mercaptan, n-dodecyl mercaptan and the like, alcohols such as isopropanol and the like can also be used as a molecular weight modifier.

In the production process of semiconductors, it is preferable that a copolymer resin does not contain a metal component from the standpoint of improving the reliability of a metal interconnect to be polished. In order to obtain such a copolymer resin free from a metal, a monomer, a polymerization initiator, and, as needed, a dispersing agent such as a water-soluble polymer, a surfactant or the like, or other additives, which are free from a metal, can be used for the production thereof.

Examples of the polymerization initiator free from a metal include hydrogen peroxide, ammonium persulfate, organic peroxides such as cumene hydroperoxide, t-butyl hydroperoxide, benzoyl peroxide and the like, azo compounds such as an azobiscyanovaleric acid, 2,2'-azobis(2-aminodipropane) dibasic acid salts and the like. One or in combination of two or more kinds thereof can be selected and used accordingly.

The initiator is preferably water-soluble. More preferably used are ammonium persulfate, an azobiscyanovaleric acid and 2,2'-azobis(2-aminodipropane) dibasic acid salts.

The amount of the initiator in general is from 0.1 to 5 mass % based on the total mass of the monomers to be (co)polymerized.

The water-soluble resin (A) having an amide group is a water-soluble copolymer resin having an amide group, and the organic resin (B) is a copolymer resin particle, whereby a change in the composition at the time of polishing is suppressed and etching is fully reduced. Thus, the polishing slurry capable of forming an embedded pattern with much higher reliability is provided. Further, the composition change on the polishing pad is suppressed, whereby a high polishing rate can be exhibited, and the occurrence of scratches, dishing or erosion can be remarkably suppressed.

Furthermore, such a slurry is capable of reducing the occurrence of depression (dishing) of a metal interconnect part because grinding debris (polished residue) on an interconnect is small, thus remarkably reducing scratches or erosion and achieving a high effect of suppressing etching, as compared to a slurry containing an insoluble complex forming agent or an etching inhibitor of a metal such as a polyacrylic acid.

In the polishing slurry of the present invention, the water-soluble resin (A) having an amide group may be contained in an amount of not less than 10 weight % and not more than 90 weight %, while the organic particle (B) may be contained in an amount of not more than 90 weight % and not less than 10 weight %, based on the total resin components.

The water-soluble resin (A) having an amide group is preferably contained in an amount of from 10 to 90 weight %, based on the total resin components from the viewpoint of the polishing quality. Further, the content of the solid content in the water-soluble resin (A) having an amide group is preferably not less than 10 weight % and more preferably not less than 30 weight %, based on the total resin solid content from the viewpoint of accelerating the polishing rate. Further, the content of the solid content in the water-soluble resin (A) having an amide group is preferably not more than 90 weight % and more preferably not more than 70 weight %, based on the total resin solid content from the viewpoint of more effectively suppressing erosion.

Meanwhile, the content of the solid content in the organic particle (B) is preferably not less than 10 weight % and more preferably not less than 30 weight %, based on the total resin solid content from the viewpoint of enhancing the polishing rate. Further, the content of the solid content in the organic particle (B) is preferably 90 weight % and more preferably not more than 70 weight %, based on the total resin solid content from the viewpoint of stabilizing the polishing rate.

Various additives may be added to the polishing slurry of the present invention. The additive can be used before, during or after the polymerization.

Examples of the additive include, though not limited to, a pH adjusting agent, a chelating agent, a pigment, a wetting agent, an anti-static agent, an anti-oxidant, a corrosion preventor, an ultraviolet absorber, a light stabilizer, a fluorescent whitening agent, a coloring agent, a penetrating agent, a foaming agent, a release agent, a defoaming agent, a foam regulating agent, a flowability improver, a thickening agent and the like.

The polishing material of the present invention contains the aforementioned polishing slurry as an essential component.

Furthermore, various compounds can be added to the polishing material of the present invention. Examples of the compound include water-soluble complex forming compounds, various oxidizing agents, nitrogen-containing heterocyclic compounds such as benzotriazole, a quinaldic acid or the like, water-soluble polymers such as a polyacrylic acid, polyvinyl alcohol, polyethylene glycol, glucose or the like, and substances such as a surfactant or the like. These compounds may be added singly or in combination of two or more kinds. The amount to be added and the kind thereof are not particularly limited as long as the object of the present invention can be achieved.

For example, the polishing material of the present invention contains the aforementioned polishing slurry, an oxidizing agent, a compound capable of forming a complex with a metal and an anti-corrosive agent.

Furthermore, the polishing material of the present invention may contain the aforementioned polishing slurry, a compound capable of forming a complex with a metal and water. Accordingly, the polishing rate can be more stably controlled.

The metal in the compound capable of forming a complex with a metal specifically refers to a metal to be polished.

Furthermore, the compound capable of forming a complex with a metal specifically refers to a water-soluble compound capable of forming a complex with a metal.

Furthermore, the polishing material of the present invention may further contain an oxidizing agent from the standpoint of polishing stability.

Furthermore, the polishing material of the present invention may contain a water-soluble compound capable of forming a complex with a metal which may be at least one selected from carboxylic acids, amines, amino acids and ammonia, and may contain an oxidizing agent which may be hydrogen peroxide. In this manner, a high polishing rate and low dishing can be further certainly combined.

The content of the total resin components is, for example, not less than 1 weight % but not more than 15 weight % based on the total polishing material. Accordingly, the polishing rate can be further enhanced.

(Complex Forming Compound)

As the compound capable of forming a complex with a metal (a complex forming compound), a water-soluble compound is preferable. Concrete examples thereof include carboxylic acids such as an acetic acid, an oxalic acid, a malic acid, a tartaric acid, a succinic acid, a citric acid and the like; amines such as methylamine, dimethylamine, triethylamine, ethylamine, diethylamine, triethylamine and the like; amino acids such as glycine, asparatic acid, glutamic acid, cysteine and the like;
ketones such as acetylacetone and the like;
N(nitrogen)-containing cyclic compounds such as imidazole and the like; and
ammonia, for the purpose of enhancing the polishing rate. Preferably used are an oxalic acid, a malic acid and ethylamine.

Meanwhile, when the polishing slurry of the present invention contains the aforementioned copolymer resin having a glass transition temperature of not less than 25 degrees centigrade as the organic resin (B), and at the same time contains the water-soluble copolymer resin having an amide group as the water-soluble resin (A) having an amide group, preferably used are carboxylic acids, amines, amino acids and ammonia, and more preferably used are an oxalic acid, a malonic acid, a tartaric acid and glycine.

The compound capable of forming a complex with a metal to be polished is preferably contained in an amount of from 0.5 to 5 weight % in the slurry from the viewpoint of suppressing etching.

The content of the compound capable of forming a complex with a metal to be polished (a complex forming compound) is preferably not less than 0.1 weight % and further preferably not less than 0.5 weight %, based on the total polishing material from the viewpoint of fully exhibiting its effect for more surely achieving the intended polishing rate.

Furthermore, the content of the complex forming compound in the polishing material is preferably not more than 10 weight % and further preferably not more than 5 weight % from the viewpoint of suppressing the excessive progress in the formation of a complex with a metal to be polished for more effectively suppressing dishing caused by elution of a metal to be polished other than the target object to be polished.

Meanwhile, for the purpose of protecting a surface to be polished, a nitrogen-containing heterocyclic compound such as benzotriazole, a quinaldic acid or the like can be added to the polishing material in a small amount. The content thereof in the polishing material is preferably not less than 0.1 weight % and further preferably not less than 0.2 weight % from the viewpoint of fully exhibiting its effect for surely obtaining the desired effect of protection. Further, the content of the nitrogen-containing heterocyclic compound in a polishing agent is preferably not more than 1 weight % and further preferably not more than 0.5 weight % from the viewpoint of suppressing a considerable decrease in the polishing rate resulted from the formation of a complex having a strong protection function with a metal to be polished.

(Oxidizing Agent)

As an oxidizing agent, hydrogen peroxide, ammonium persulfate and the like can be used, but preferably used is hydrogen peroxide. The content of the oxidizing agent in the slurry is preferably not less than 0.1 weight % and further preferably not less than 0.5 weight % from the viewpoint that the chemical reaction of a metal with a resin is processed for surely attaining the intended polishing rate. Furthermore, the content of the oxidizing agent is preferably not more than 15 weight % and further preferably not more than 5 weight % from the viewpoint of suppressing the inhibition of the progress of polishing due to passivation of an oxide film generated on the metal surface.

(pH)

In the polishing material of the present invention, the pH is preferably 7 or higher and 11 or lower from the standpoint of the polishing quality. Furthermore, the pH is preferably not less than 7 but not more than 9 from the viewpoint of the reduction in erosion.

Furthermore, the pH of the polishing material of the present invention is preferably not less than 5 and further preferably not less than 7 from the viewpoint of more surely suppressing elution of a metal for more effectively suppressing dishing. Further, the pH of the polishing material is preferably not more than 11 and further preferably not more than 9 from the viewpoint of more effectively suppressing an insulating film from being dissolved or partially decomposed when a semiconductor insulating film and a metal interconnect are present on the same surface, which is the final point in polishing a metal film.

Furthermore, when the polishing slurry of the present invention contains the aforementioned copolymer resin having a glass transition temperature of not less than 25 degrees centigrade as the organic resin (B) and at the same time contains the water-soluble copolymer resin having an amide group as the water-soluble resin (A) having an amide group, the pH of the polishing material is preferably not less than 7. In this way, the progress of corrosion of a metal and elution of metal ions are much more surely suppressed so that it is possible to more fully suppress the formation of defects such as dishing, fang or the like. Herein, fang refers to a depression in a shape of slit generated when the corrosion reaction at an interfacial portion of a copper layer and a barrier metal layer is promoted and copper ions are eluted.

Also, in this case, the pH of the polishing material is preferably not more than 11 and further preferably not more than 9. So, an insulating film is even further suppressed from being dissolved or partially decomposed when a semiconductor insulating film and a metal interconnect are present on the same surface, which is the final point in polishing a metal film.

Further, in this configuration, the pH of the polishing slurry is preferably not less than 8 but not more than 10 from the viewpoint of stably forming a complex of the anionic water-soluble resin (A) having an amide group with the organic particle (B).

A substance used for the adjustment of pH of this polishing material is not particularly limited. Examples of an alkaline substance free from a metal include ammonia, amines such as triethylamine, diethylamine, ethylamine, trimethylamine, dimethylamine, methylamine, triethanolamine, diethanolamine, monoethanolamine and the like;
inorganic substances such as NaOH, KOH and the like; and alkyl ammonium salts such as tetramethyl ammonium hydroxide, tetraethyl ammonium hydroxide and the like.

Further, examples of an acidic substance include inorganic substances such as a hydrochloric acid, a nitric acid and the like; and organic substances such as an acetic acid, an oxalic acid, a citric acid and the like. These pH adjusting agents may also be a water-soluble compound that can be a ligand of the aforementioned metals, and may be the water-soluble compound capable of forming a complex with a metal as described above. Further, these substances may be used in combination of two or more kinds.

(Production Method of Polishing Slurry)

As a method for producing the polishing slurry of the present invention, there can be cited, for example, a method including synthesizing the water-soluble resin (A) having an amide group and the organic particle (B) separately and then mixing, a method including polymerizing the organic particle (B) in the presence of the water-soluble resin (A) having an amide group, and a method including synthesizing the water-soluble resin (A) in the presence of the organic particle (B). Of these methods, preferably used is a method of polymerizing the organic particle (B) by the emulsion polymerization in the presence of the water-soluble resin (A) having an amide group from the viewpoint of the dispersibility of the organic particle (B).

(Production Method of Polishing Material)

The polishing material can be produced by slowly adding the polishing slurry, water, a complex forming compound, a pH adjusting agent and the like. The production method is not particularly limited, preferably used is a method including adding an aqueous solution of a complex forming compound having an adjusted pH to the polishing slurry having an adjusted pH, and well stirring and mixing. Thereafter, an oxidizing agent is slowly added thereto, and the resulting solution is further stirred and mixed.

After adjusting the final pH and concentration of the mixture, insoluble substances and aggregates are removed therefrom by filtering using a filter paper to give a polishing material. This polishing material is concretely a polishing material for CMP.

Meanwhile, when the water-soluble resin (A) having an amide group is a water-soluble copolymer resin having an amide group and the organic resin (B) is a copolymer resin particle, a polishing material can be produced by slowly adding a water-soluble copolymer resin particle having a functional group capable of capturing metal ions and having an amide group, water, a complex forming compound, a pH adjusting agent and the like.

The production method is not particularly limited, but an aqueous solution of a complex forming compound having an adjusted pH and a copolymer resin particle having an adjusted pH are preferably stirred and mixed little by little. So, after adjusting the final pH and concentration of the mixture, insoluble substances and aggregates are removed therefrom to give a polishing material.

(Other Additives)

An additive can be used at any time before, during or after the polymerization of a copolymer resin.

Examples of the additive include an anti-corrosive agent, a wetting agent, an anti-static agent, an anti-oxidant, a corrosion preventor, an ultraviolet absorber, a light stabilizer, a fluorescent whitening agent, a coloring agent, a penetrating agent, a foaming agent, a release agent, a defoaming agent, a foam regulating agent, a foam suppressing agent, a flowability improver, a thickening agent and the like. However, in the semiconductor process, an additive free from a metal can be properly selected.

As an anti-corrosive agent, nitrogen-containing heterocyclic compounds such as benzotriazole, a quinaldic acid, a quinolinic acid and the like, and aromatic amino acids such as phenylalanine and the like may be added singly or in combination of two or more kinds.

In addition, as a polishing accelerator, halides containing chlorine, fluorine and iodine may be added singly or in combination of two or more kinds.

The amount to be added and the kind of various additives are not particularly limited as long as the object of the present invention can be achieved.

According to the polishing slurry of the present invention, since it is possible to suppress damages to an under layer while securing an adequate polishing rate, for example, in an interconnect-forming process for the production of semiconductor devices, it is possible to polish and smooth an object to be polished without damaging an insulating film surface or metal interconnects such as tungsten, aluminum, copper or the like. Furthermore, it is possible to provide a polishing slurry exhibiting a high polishing rate and remarkably suppressing the occurrence of scratches or erosion.

The present invention includes the following embodiments.

(1-1) a polishing slurry (an emulsion for a polishing material) including a resin (A) having an amide group and a resin (B) obtainable by subjecting one or more vinyl monomers to an emulsion polymerization;

(1-2) the polishing slurry as set forth in (1-1) obtainable by mixing the resin (A) having an amide group and the resin (B) obtainable by subjecting one or more vinyl monomers to an emulsion polymerization;

(1-3) the polishing slurry as set forth in (1-1), wherein the resin (B) is a resin obtainable by subjecting one or more vinyl monomers to an emulsion polymerization in the presence of the resin (A) having an amide group;

(1-4) the polishing slurry as set forth in (1-1), wherein the resin (A) having an amide group is a resin obtainable by the polymerization in the presence of the resin (B) obtainable by subjecting one or more vinyl monomers to an emulsion polymerization;

(1-5) the polishing slurry as set forth in any one of (1-1) to (1-4), wherein the resin (A) is contained in an amount of not less than 10 weight % and not more than 90 weight %, based on the total resin components;

(1-6) a polishing material (polishing slurry) containing the polishing slurry as set froth in any one of (1-1) to (1-5), a compound capable of forming a complex with a metal to be polished and water;

(1-7) the polishing material as set forth in (1-6), wherein the total resin components are contained in an amount of not less than 1 weight % and not more than 15 weight % in the polishing material;

(1-8) the polishing material as set forth in (1-6) or (1-7), wherein the compound capable of forming a complex with a metal to be polished is contained in an amount of not less than 0.5 weight % and not more than 5 weight % in the polishing material;

(1-9) the polishing material as set forth in any one of (1-6) to (1-8), wherein the pH of the polishing material is not less than 7 but not more than 9;

(1-10) the polishing material as set forth in any one of (1-6) to (1-9), further containing an oxidizing agent;

(2-1) a polishing slurry (a slurry for polishing a metal) containing a water-soluble copolymer resin (A) having an amide group and a particle (B) consisting of a copolymer resin having a glass transition temperature of not less than 25 degrees centigrade;

(2-2) the polishing slurry as set forth in (2-1), wherein the particle (B) consisting of a copolymer resin as set forth in (2-1) has a functional group capable of capturing metal ions;

(2-3) the polishing slurry as set forth in (2-2), wherein the functional group capable of capturing metal ions as set forth in (2-2) is at least one selected from a carboxyl group, an amide group, a sulfonic acid group, a phosphoric acid group, a cyano group, a carbonyl group and a hydroxy group;

(2-4) the polishing slurry as set forth in (2-1), wherein the particle (B) consisting of a copolymer resin consists of a copolymer resin having a functional group capable of capturing metal ions and the water-soluble copolymer resin (A) is a copolymer resin obtainable by polymerizing a vinyl monomer having an amide group;

(2-5) the polishing slurry as set forth in (2-4), wherein the water-soluble copolymer resin (A) obtainable by polymerizing a vinyl monomer having an amide group covers an outer part and/or a surface part of the particle (B) consisting of a copolymer resin having a functional group capable of capturing metal ions;

(2-6) the polishing slurry as set forth in (2-4) or (2-5), wherein the vinyl monomer having an amide group as set forth in (2-4) or (2-5) is (meth)acrylamide; and (2-7) the polishing slurry as set forth in any one of (2-1) to (2-6), further containing an oxidizing agent, a water-soluble compound capable of forming a complex with a metal and an anti-corrosive agent.

EXAMPLES

The present invention is now illustrated in detail below with reference to Examples. However, the present invention is not limited to these Examples.

Incidentally, part(s) and % in Examples indicate weight parts and weight % unless otherwise specifically designated.

Furthermore, the molecular weights of the water-soluble resins (A) having an amide group obtained in the following Examples were all in the range of 5,000 to 500,000.

A polishing material using a polishing slurry was evaluated in the following manner.

1. Polishing Rate

Polishing material: Polishing slurries in Examples and Comparative Examples are included.

Object to be polished: 8-inch silicon wafer in which 5,000 Å of a thermal oxide film, 300 Å of a Ta film formed by the sputtering method, 1,500 Å of a seed copper film for plating formed by the CVD method, 15,000 Å of a copper film formed by the plating method are formed on a substrate of the silicon wafer Polishing device: MIRRA3400, a product of Applied Materials, Inc.

Polishing pad: IC1400 XY Groove, a product of Nitta Hass Inc.

Polishing load: 2.0 psi
Polishing time: 1 min.
Polishing material supply: 200 cc/min.
Table rotation speed: 87 rpm
Head rotation speed: 83 rpm 1) Calculation of Polishing Rate An object to be polished was subjected to an ultra pure water rinse and ultrasonic cleaning, and then dried. A film thickness was measured before and after polishing by measuring the sheet resistance using a 4-point probe. An average polishing rate was calculated from the change in the film thickness and the polishing time.

2) Surface Defects

The object to be polished after being polished was washed with ultra pure water and dried, and then its surface was observed using a differential interference contrast microscope with a magnification of ×2500. Incidentally, damages to the surface having a length of not less than 0.1 μm were determined as scratches.

○: 5 damages or scratches or less
x: more than 5 damages or scratches

2. Measurement of Amount of Erosion

The amount of erosion was measured in the following method. The object was polished under the above polishing conditions and then the occurrence of erosion was confirmed from the shapes of a Ta film and an $SiO_2$ film in accordance with cross-sectional SEM (Scanning Electron Microscope) photographs of trenches having an interconnect width of 100 μm and an interconnect width of 10 μm of a pattern-formed wafer (SEMATECH #854).

Removal of a part or all over film: Erosion occurred (x)
No removal of film: No erosion (○)

3. Evaluation of Storage Stability

A polishing slurry was allowed to stand for 6 hours at atmospheric pressure and room temperature. Then, the state of the polishing slurry was visually observed.

○: No supernatant and precipitate generated
x: Supernatant and precipitate generated (Production Example 1 of Water-soluble Resin (A) Having Amide Group)

In a separable flask equipped with a stirrer and a reflux condenser was charged 200 weight parts of distilled water. The atmosphere therein was replaced with nitrogen gas and then the flask was heated up to 80 degrees centigrade. Subsequently, 2.0 parts of ammonium persulfate was added thereto and then a mixture of a vinyl monomer and water with the following composition was continuously added over 2 hours under stirring, and then matured at the same temperature for 2 hours for completing the polymerization. An aqueous liquid of a water-soluble resin (A-1) having an amide group with the solid content of 20.0% was obtained.

methacrylamide: 65.0 parts
methacrylic acid: 10.0 parts
2-hydroxyethyl methacrylate: 20.0 parts
methyl acrylate: 5.0 parts
distilled water: 200.0 parts The molecular weight of the obtained water-soluble resin (A-1) having an amide group was measured in accordance with the GPC-MALLS method using PULLULAN (product name: Shodex, a product of Showa Denko Kabushiki Kaisha) standards. As a result, the weight-average molecular weight Mw was 39720.

Example 1

In a separable flask equipped with a stirrer and a reflux condenser was charged 360 weight parts of distilled water. The atmosphere therein was replaced with nitrogen gas and then the flask was heated up to 80 degrees centigrade. Subsequently, 2.0 parts of ammonium persulfate was added thereto and then a vinyl monomer emulsion with the following composition was continuously added over 3 hours and further maintained for 3 hours for completing the polymerization. A copolymer resin with the solid content of 20.0%, i.e., an organic particle (B-1) was obtained. The particle diameter of the obtained organic particle (B-1) was 154 nm.

Incidentally, in this Example and the following Examples, unless otherwise specifically mentioned, the particle diameter of the organic particle (B) was obtained by the dynamic light scattering technique, and the number average particle diameter was taken as the particle diameter.

The previously obtained copolymer resin, i.e., the water-soluble resin (A-1) having an amide group was mixed at a ratio of (A):(B)=1:9 thereto to produce a polishing slurry (1).

(Vinyl Monomer Emulsion)

n-butyl acrylate: 95.0 parts methacrylic acid: 5.0 parts ammonium lauryl sulfate: 0.1 part distilled water: 40.0 parts

Example 2

To 1,167 parts of an aqueous liquid of the previously obtained resin (A-1) was added 360 parts of distilled water for adjusting the solid content. The atmosphere was again replaced with nitrogen and the resulting mixture was heated up to 80 degrees centigrade. Subsequently, 1.0 part of ammonium persulfate was added thereto and then a vinyl monomer emulsion with the following composition was continuously added over 3 hours and further maintained for 3 hours for completing the polymerization. A polishing slurry (2) with the solid content of 20.0% was obtained. The particle diameter of the obtained organic particle (B-1) was 150 nm.

(Vinyl Monomer Emulsion)

styrene: 55.0 parts 2-ethylhexyl acrylate: 40.0 parts acrylic acid: 5.0 parts ammonium lauryl sulfate: 0.1 part distilled water: 40.0 parts

Example 3

The pH of an aqueous solution of an oxalic acid was adjusted to 8.3 by using ammonia. This solution, the polishing slurry (1) in Example 1 having the pH adjusted to 8.3 with ammonia, pure water, 30% hydrogen peroxide and benzotriazole were well mixed to produce a polishing material having the pH of 8.3 with 5.0 weight % of an emulsion for polishing materials, 2.0 weight % of hydrogen peroxide, 1.0 weight % of an oxalic acid and 0.018 weight % of benzotriazole.

Polishing performance was evaluated in accordance with the above method. As a result, it was confirmed that, since polishing could be done at a given rate and any surface defects were not found even though the polishing time took longer, this polishing material was stabilized against a physical load upon polishing and did not cause scratches on the object to be polished. The results are shown in Table 1.

Furthermore, the particle diameter of the particle in the polishing material of this Example was measured by the dynamic light scattering technique and observation with the transmission electron microscope (TEM). The particle diameter d1 measured by the dynamic light scattering technique was 154 nm, while the particle diameter d2 obtained by TEM observation was 110 nm.

From the results, it was indirectly considered that the water-soluble resin (A) having an amide group was present in the vicinity of the resin particle (B) to cover it.

Example 4

The same operation as in Example 3 was conducted, except that the polishing slurry (2) of Example 2 was used instead of the polishing slurry (1) of Example 1. The polishing results are shown in Table 1.

Comparative Example 1

The same operation and evaluation as in Example 3 were conducted, except that a commercial colloidal silica (PL-1, a product of Fuso Chemical Co., Ltd.) was used instead of the polishing slurry (1) of Example 1. The results are shown in Table 1.

Comparative Example 2

The same operation and evaluation as in Example 3 were conducted, except that a commercial alumina (AEROXIDE AluC, a product of Nippon Aerosil Co., Ltd.) was used instead of the polishing slurry (1) of Example 1. The results are shown in Table 1.

Example 5

This Example relates to a polishing slurry obtained by polymerizing a water-soluble resin (A) having an amide group in the presence of an organic particle (B).

In a separable flask equipped with a stirrer and a reflux condenser was charged 360 weight parts of distilled water. The atmosphere therein was replaced with nitrogen gas and then the flask was heated up to 80 degrees centigrade. Subsequently, 2.0 parts of an azobiscyanovaleric acid was added thereto and then a vinyl monomer emulsion with the following composition was continuously added over 3 hours and further maintained for 3 hours for completing the polymerization. A copolymer resin with the solid content of 20.0%, i.e., an organic particle (B-2) was obtained. The particle diameter of the obtained organic particle (B-2) was 191 nm.

(Vinyl Monomer Emulsion)

styrene: 77.0 parts acrylonitrile: 20.0 parts methacrylic acid: 3.0 parts ammonium lauryl sulfate: 0.1 part distilled water: 40.0 parts 500 parts of an aqueous liquid of the previously obtained organic particle (B-2) was again replaced with nitrogen and heated up to 80 degrees centigrade. Subsequently, 2.0 parts of ammonium persulfate was added thereto, and then a mixture of a vinyl monomer and water with the following composition was continuously added over 2 hours under stirring, and then matured at the same temperature for 2 hours for completing the polymerization. A polishing slurry (3) with the solid content of 20.0% was obtained.

methacrylamide: 89.5 parts methacrylic acid: 5.0 parts methyl methacrylate: 5.0 parts methylenebisacrylamide: 0.5 part distilled water: 400.0 parts The same operation as in Example 3 was conducted using the obtained polishing slurry (3) instead of the polishing slurry (1) of Example 1. The polishing results are shown in Table 1.

Example 6

In this Example, the content of the water-soluble resin (A) having an amide group and the organic particle (B) in Example 1 was changed.

In Example 1, the water-soluble resin (A) having an amide group and the organic particle (B) were mixed at a ratio of (A):(B)=4:6 to produce a polishing slurry (4) and the same operation as in Example 3 was conducted. The results are shown in Table 1.

Example 7

In this Example, the compound capable of forming a complex in Example 3 was changed.

The same operation as in Example 3 was conducted, except that a malic acid was used instead of an oxalic acid of Example 3 and the polishing slurry (2) of Example 2 was used instead of the polishing slurry (1) of Example 3. The results are shown in Table 1.

Example 8

In this Example, the oxidizing agent of Example 7 was changed.

The same operation as in Example 7 was conducted, except that the oxidizing agent of Example 7 was changed from hydrogen peroxide to ammonium persulfate. The results are shown in Table 1.

Comparative Example 3

In this Comparative Example, the polishing slurry contained only the water-soluble resin (A) having an amide group, but did not contain the organic particle (B).

The water-soluble resin (A) having an amide group and the organic particle (B) in Example 1 were mixed at a ratio of (A):(B)=10:0 to produce a polishing slurry (5), and the same operation as in Example 3 was conducted. The results are shown in Table 1.

Comparative Example 4

In this Comparative Example, the polishing slurry contained only the organic particle (B), but did not contain the water-soluble resin (A) having an amide group.

The water-soluble resin (A) having an amide group and the organic particle (B) in Example 1 were mixed at a ratio of (A):(B)=0:10 to produce a polishing slurry (6), and the same operation as in Example 3 was conducted. The results are shown in Table 1.

TABLE 1

|  | Polishing Rate (Å/min) | Scratch | Erosion | Storage Stability |
|---|---|---|---|---|
| Example 3 | 5300 | ○ | ○ | ○ |
| Example 4 | 5600 | ○ | ○ | ○ |
| Example 5 | 5100 | ○ | ○ | ○ |
| Example 6 | 5200 | ○ | ○ | ○ |
| Example 7 | 4900 | ○ | ○ | ○ |
| Example 8 | 5700 | ○ | ○ | ○ |
| Comparative Example 1 | 2900 | x | Δ | x |
| Comparative Example 2 | 3500 | x | x | x |
| Comparative Example 3 | 2200 | ○ | ○ | ○ |
| Comparative Example 4 | 1800 | ○ | ○ | ○ |

From Table 1, the polishing materials of Examples 3 to 8 maintained the polishing rate and were excellent in an effect of suppressing erosion at the same time.

Furthermore, in the following Examples and Comparative Examples, the polishing slurries were evaluated in the following method.

1. Polishing Rate

Polishing material: Polishing slurries in Examples and Comparative Examples are included.

Object to be polished: 8-inch silicon wafer in which 5,000 Å of a thermal oxide film, 300 Å of a Ta film formed by the sputtering method, 1,500 Å of a seed copper film for plating formed by the CMP method, 15,000 Å of a copper film formed by the plating method are formed on a substrate of the silicon wafer, an interconnect pattern-formed silicon wafer (SEMATECH #854)

Polishing device: MAT-ARW-681M, a product of MAT Corporation

Polishing pad: IC-1000/suba400, a product of Nitta Hass Inc.

Polishing load: 3.0 psi

Polishing time: 1 min.

polishing material supply: 200 cc/min.

Table rotation speed: 90 rpm

Head rotation speed: 90 rpm

2. Calculation of Polishing Rate

An object to be polished was subjected to an ultra pure water rinse and ultrasonic cleaning, and then dried. A film thickness was measured before and after polishing by measuring the sheet resistance using a 4-point probe.

An average polishing rate was calculated from the change in the film thickness and the polishing time.

3. Measurement of Dishing

An interconnect pattern-formed wafer (SEMATECH #854) was polished under the aforementioned polishing conditions using the polishing material of each Example and Comparative Example, and then a depth of a concave in the center of a copper interconnect trench having an interconnect width of 10 μm was measured with a stylus profilometer.

The polishing time was 1.5 times of the usual time required until polishing copper in a portion without any trenches formed therein was completed for excessive polishing.

4. Measurement of Etching 2.0% of hydrogen peroxide, 0.04% of benzotriazole and 0.08% of copper (II) acetate were added to 70 cc of a polishing material. A metal copper plate (20×20×1 mm) was immersed therein. The polishing solution was stirred at 1,000 rpm and maintained for 10 minutes. From the weight change before and after immersion, the etching speed was calculated.

(Production Example 2 of Water-soluble Resin (A) Having Amide Group)

In this Example, a copolymer resin (A-2) having an amide group was produced as the water-soluble resin (A) having an amide group in the following manner.

In a separable flask equipped with a stirrer and a reflux condenser was charged 200 weight parts of distilled water. The atmosphere therein was replaced with nitrogen gas and then the flask was heated up to 75 degrees centigrade. Subsequently, 2.0 parts of ammonium persulfate was added thereto, and then a mixture of 99 weight parts of acrylamide, 1 weight part of a methacrylic acid and 200 weight parts of distilled water was continuously added over 2 hours under stirring, and then matured at the same temperature for 2 hours for completing the polymerization. A copolymer resin (A-2) having an amide group was obtained.

Example 9

In a separable flask equipped with a stirrer and a reflux condenser were charged 260 weight parts of distilled water and 100 weight parts of the copolymer resin (A-2) having an amide group synthesized in Production Example 2. The atmosphere therein was replaced with nitrogen gas and then the flask was heated up to 80 degrees centigrade. Subsequently, 2.0 parts of ammonium persulfate was added thereto, and then an emulsion of a vinyl monomer and distilled water with the composition as illustrated in Table 2 was continuously added to the above flask over 4 hours under stirring, and further maintained for 4 hours for completing the polymerization. A polishing slurry containing the copolymer resin (A-2) and the particle (B-3) consisting of the copolymer resin having a glass transition temperature of not less than 25 degrees centigrade as the organic particle (B) was obtained.

Incidentally, the particle diameter of the obtained organic particle (B-3) was 188 nm.

Examples 10 to 16

A polishing slurry was obtained in the same manner as in Example 9, except that an organic particle (B) was produced by using a vinyl monomer with the composition (weight ratio) as described in Table 2 or 3 in Example 9. The calculated Tg value of the copolymer resin was obtained by calculating Tg of a homopolymer of a vinyl monomer using a mathematical science software Cheops ver. 4 (Million Zillion Software Inc.) for obtaining the calculated Tg value of the copolymer resin as described in Table 1 using the Fox formula.

In this Example and the following Examples, Tgs of the copolymer resins were calculated by using the following Tg values of each monomer homopolymer.

methyl methacrylate: 377K
styrene: 376K
acrylonitrile: 422K
butyl methacrylate: 287K
butyl acrylate: 242K
methacrylic acid: 417K
ethyl acrylate: 262K
acetoacetoxy methacrylate: 324K Furthermore, the particle diameters of organic particles (B) obtained in Examples 10 to 13 were respectively as follows.
Example 10: 160 nm
Example 11: 110 nm
Example 12: 159 nm
Example 13: 239 nm

TABLE 2

|  | Example 9 | Example 10 | Example 11 | Example 12 |
|---|---|---|---|---|
| methyl methacrylate | 90 |  | 80 | 80 |
| styrene |  | 65 |  |  |
| methacrylic acid | 10 | 10 | 10 | 10 |
| acrylonitrile |  | 25 |  |  |
| butyl acrylate |  |  |  | 10 |

TABLE 2-continued

|  | Example 9 | Example 10 | Example 11 | Example 12 |
|---|---|---|---|---|
| acetoacetoxyethyl methacrylate |  |  | 10 |  |
| Calculated Tg value (° C.) | 108 | 117 | 101 | 87 |

TABLE 3

|  | Example 13 | Example 14 | Example 15 | Example 16 |
|---|---|---|---|---|
| ethyl acrylate |  | 80 |  | 100 |
| butyl acrylate |  |  | 65 |  |
| butyl methacrylate | 75 |  |  |  |
| methacrylic acid | 250 | 15 | 35 |  |
| styrene |  | 5 |  |  |
| Calculated Tg value (° C.) | 38 | 9.0 | −11 | −11 |

Examples 17 and 18

In a separable flask equipped with a stirrer and a reflux condenser was charged 360 weight parts of distilled water. The atmosphere therein was replaced with nitrogen gas and then the flask was heated up to 80 degrees centigrade. Subsequently, 2.0 parts of ammonium persulfate was added thereto, and then an emulsion of a vinyl monomer and distilled water with the composition (weight ratio) as described in Table 4 was continuously added to the above flask over 4 hours under stirring, and further maintained for 4 hours for completing the polymerization. The particle diameters of organic particles (B) obtained in each Example were respectively as follows.
Example 17: 167 nm
Example 18: 153 nm The obtained copolymer resin, i.e., an organic resin (B) and the copolymer resin (A-2) having an amide group synthesized in Example 9 were mixed by a stirrer such that the weight ratio thereof was 1:1.

TABLE 4

|  | Example 17 | Example 18 |
|---|---|---|
| methyl methacrylate | 90 |  |
| styrene |  | 65 |
| methacrylic acid | 10 | 10 |
| acrylonitrile |  | 25 |
| Calculated Tg value (° C.) | 108 | 117 |

Examples 19 to 28 and Comparative Example 5

Polishing materials were produced in the following method.

A compound capable of forming a complex (a complex forming agent) was neutralized with ammonia and then was added dropwise to the slurry containing 10 weight parts (in terms of the solid content) in total of copolymer resins A and B produced in Examples 9 to 18, and hydrogen peroxide (2%) and an anti-corrosive agent benzotriazole (0.04%) were added right before the polishing.

Furthermore, in Comparative Example 5, a polishing material was produced in the same manner as in Examples 19 to 28, except that copolymer resins A and B were not contained.

In Tables 5 to 7, the components, combination and pH of the polishing materials in each Example and Comparative Example are illustrated. Furthermore, in Table 8, the evaluation results of these polishing materials are shown.

TABLE 5

|  | Example 19 | Example 20 | Example 21 | Example 22 | Example 23 |
|---|---|---|---|---|---|
| Copolymer resin | Example 9 | Example 10 | Example 11 | Example 12 | Example 13 |
| Copolymer resin concentration | 5% | 5% | 5% | 5% | 5% |
| Complex forming agent | Oxalic acid | Malonic acid | Glycine | Malonic acid | Glycine |
| Complex forming agent concentration | 1.0% | 2.0% | 1.0% | 1.0% | 0.9% |
| pH of polishing material | 8.0 | 7.8 | 8.3 | 8.0 | 7.5 |

TABLE 6

|  | Example 24 | Example 25 |
|---|---|---|
| Copolymer resin | Example 17 | Example 18 |
| Copolymer resin concentration | 5% | 5% |
| Complex forming agent | Oxalic acid | Malonic acid |
| Complex forming agent concentration | 1.0% | 2.0% |
| pH of polishing material | 8.0 | 7.8 |

TABLE 7

|  | Comparative Example 5 | Example 26 | Example 27 | Example 28 |
|---|---|---|---|---|
| Copolymer resin | No | Example 14 | Example 15 | Example 16 |
| Copolymer resin concentration | 0% | 5% | 5% | 5% |
| Complex forming agent | Oxalic acid | Oxalic acid | Glycine | Malonic acid |
| Complex forming agent concentration | 1.0% | 1.0% | 1.0% | 2.0% |
| pH of polishing material | 8.0 | 7.8 | 8.3 | 8.0 |

TABLE 8

|  | Resin particle (B) Calculated Tg value (° C.) | Polishing rate (nm/min) | Dishing (nm) | Etching rate (Å/min) |
|---|---|---|---|---|
| Example 19 | 108 | 700 | 75 | 760 |
| Example 20 | 117 | 840 | 42 | 810 |
| Example 21 | 101 | 720 | 84 | 640 |
| Example 22 | 87 | 690 | 69 | 590 |
| Example 23 | 38 | 650 | 70 | 610 |
| Example 24 | 108 | 690 | 85 | 730 |
| Example 25 | 117 | 730 | 53 | 810 |
| Example 26 | 9.0 | 490 | 280 | 2200 |
| Example 27 | −11 | 360 | 230 | 1300 |
| Example 28 | −11 | 480 | 140 | 1900 |
| Comparative Example 5 | No | 30 | 250 | 1100 |

From Table 8, polishing materials of Examples 19 to 28 maintained the polishing rate, and were excellent in a balance of an effect of suppressing erosion and an effect of suppressing dishing.

The invention claimed is:

1. A polishing material containing a water-soluble resin (A) having an amide group which is a (co)polymer of methacrylamide or acrylamide and an organic abrasive particle (B) which is an emulsion polymer of one or more vinyl monomers, wherein said water-soluble resin (A) and said organic abrasive particle (B) are contained at a ratio of 1:9 to 7:3 and wherein the pH of the polishing material is not less than 7 and not more than 9.

2. The polishing material as set forth in claim 1, wherein said water-soluble resin (A) having an amide group is a water-soluble copolymer resin having an amide group and said organic abrasive particle (B) is a particle consisting of a copolymer resin having a glass transition temperature of not less than 25 degrees centigrade.

3. The polishing material as set forth in claim 2, wherein said copolymer resin having a glass transition temperature of not less than 25 degrees centigrade has a functional group capable of capturing metal ions.

4. The polishing material as set forth in claim 3, wherein said functional group capable of capturing metal ions is at least one selected from the group consisting of a carboxyl group, an amide group, a sulfonic acid group, a phosphoric acid group, a cyano group, a carbonyl group and a hydroxyl group.

5. The polishing material as set forth in claim 3, wherein said copolymer resin having an amide group covers an outer part and/or a surface part of the particle consisting of said copolymer resin having said functional group capable of capturing metal ions.

6. The polishing material as set forth in claim 1, further comprising an oxidizing agent, a compound capable of forming a complex with a metal and an anti-corrosive agent.

7. The polishing material as set forth in claim 1, further comprising a compound capable of forming a complex with a metal and water.

8. The polishing material as set forth in claim 7, further comprising an oxidizing agent.

9. The polishing material as set forth in claim 6, wherein the content of said compound capable of forming a complex with a metal is not less than 0.5 weight % but not more than 5 weight %, based on the total polishing material.

10. The polishing material as set forth in claim 1, wherein said organic abrasive particle (B) is a particle consisting of a copolymer resin having a glass transition temperature of not less than 25 degrees centigrade.

* * * * *